United States Patent [19]

Iwamura et al.

[11] 4,402,037

[45] Aug. 30, 1983

[54] CATHODE-RAY TUBE SOCKET SUBSTRATE

[75] Inventors: Eiji Iwamura; Keiichi Motoyama, both of Nagaokakyo, Japan

[73] Assignee: Murata Manufacturing Co., Ltd., Japan

[21] Appl. No.: 188,227

[22] Filed: Sep. 17, 1980

[51] Int. Cl.³ .............................................. H05K 7/02

[52] U.S. Cl. ....................................... 361/423; 315/3; 338/219; 361/380

[58] Field of Search ........... 339/192 T, 193 R, 193 N, 339/193 P; 315/3; 361/331, 380, 397, 402, 409, 361/410, 423; 338/219, 220, 128, 319, 320

[56] References Cited

U.S. PATENT DOCUMENTS

| | | | |
|---|---|---|---|
| 2,877,438 | 3/1959 | Gluffrida | 361/423 |
| 2,885,603 | 5/1959 | Rose | 361/423 |
| 2,910,627 | 10/1959 | Matteson | 361/423 |
| 3,305,702 | 2/1967 | Manetti | 361/423 |
| 3,728,587 | 4/1973 | Offerman | 361/423 |

*Primary Examiner*—G. P. Tolin

*Attorney, Agent, or Firm*—Ostrolenk, Faber, Gerb & Soffen

[57] ABSTRACT

A cathode-ray tube socket substrate, which is to be used by being attached to a cathode-ray tube in a color cathode-ray tube display unit such as a color television receiver and the like, is disclosed. The tube socket substrate comprises at least a cathode-ray tube socket, associated color output circuitry around the cathode-ray tube, and a high-voltage variable resistor, all three elements being mounted on an insulating substrate, on which is provided a film resistor forming a resistance part of the high-voltage variable resistor, and a plurality of corresponding terminal electrodes. Connected to these terminal electrodes are pin terminals for the focusing electrode of the cathode-ray tube socket, and a terminal part onto which is connected an output terminal of a rectifier circuit. Further, the high-voltage variable resistor for taking-out the focus voltage is incorporated compactly into the socket substrate, which enables the whole apparatus to be made small-sized and that without fear of causing inductive or other interference.

4 Claims, 3 Drawing Figures

CATHODE-RAY TUBE SOCKET SUBSTRATE

BACKGROUND OF THE INVENTION

1. Field of the Invention

This invention relates to a cathode-ray tube socket substrate which is to be attached to a color cathode-ray tube in a cathode-ray tube display unit such as a color television receiver and the like.

2. Description of the Prior Art

In the color television receiver, there is used in general a socket substrate comprising a color output circuit and a circuit for connecting the screen voltage to the screen electrode, such circuits being constructed on an insulating substrate provided with a cathode-ray tube socket.

However, the circuits which are to be connected to the cathode-ray tube are not limited to the above-mentioned color output circuit or circuit for connecting the screen voltage, but also there are used, for example, a circuit for connecting the focus voltage to be connected to the focusing electrode of the cathode-ray tube, etc.

This circuit for connecting the focus voltage to the focus electrode is so constructed as to remove the voltage from the high-voltage winding of a fly-back transformer with the interposition of the rectifier circuit and high-voltage variable resistor in such a manner that, in the interior of a television set, the high-voltage variable resistor is located on the mounting plate which is set upright on the chassis body, and that an line out of the above resistor is connected to an appointed pin terminal of the cathode-ray tube socket being mounted on the socket substrate. Such being the case, there will happen some inconvenience in conventional television receivers that a broader space is required for the provision of a high-voltage variable resistor therein, otherwise an inductive or similar interference may be brought about owing to the presence of the line out of the same resistor.

BRIEF SUMMARY OF THE INVENTION

Therefore, at the time of providing the insulating substrate on which the cathode-ray tube socket is to be mounted with the high-voltage variable resistor for connecting the focus voltage to the focus electrode, the present invention contemplates providing the insulating substrate with both a film resistor forming a resistance part of the high-voltage variable resistor and a plurality of corresponding terminal electrodes, and connecting the focusing electrode pin terminal of the cathode-ray tube socket and the terminal part to which are to be connected the output terminal of the rectifier circuit, respectively, to the same terminal electrodes.

It is an object of the present invention to provide a cathode-ray tube socket substrate of small size which does not require superfluous space in the interior of a television set because of a high-voltage variable resistor being compacted in one body therewith.

Another object of the present invention is to provide a cathode-ray tube socket substrate where the outgoing line of the focus voltage can be omitted, and where there is no fear of the occurrence of inductive and similar interference.

A further object of the present invention is to provide a cathode-ray tube socket substrate which is simple in structure, very easy to assemble and advantageous from a viewpoint of production cost.

These objects can be achieved by a combination and improvement of each part constituting the present invention. A preferred embodiment will be now given describing more particularly with reference to the accompanying drawings.

DETAILED DESCRIPTION IN RELATION TO DRAWINGS

Figure 1:
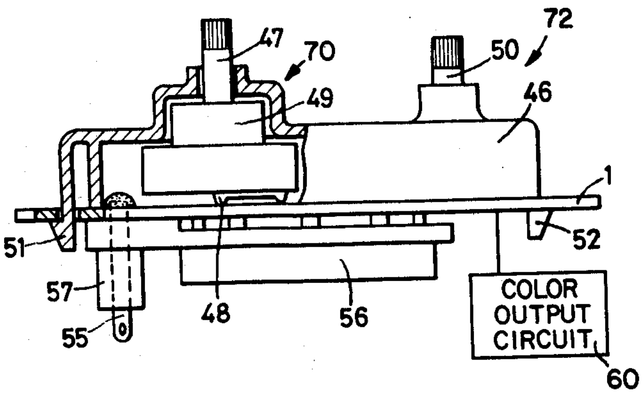
FIG. 1 is a cutaway side view of the principal part of a cathode-ray tube socket substrate according to the present invention.
Figure 2:
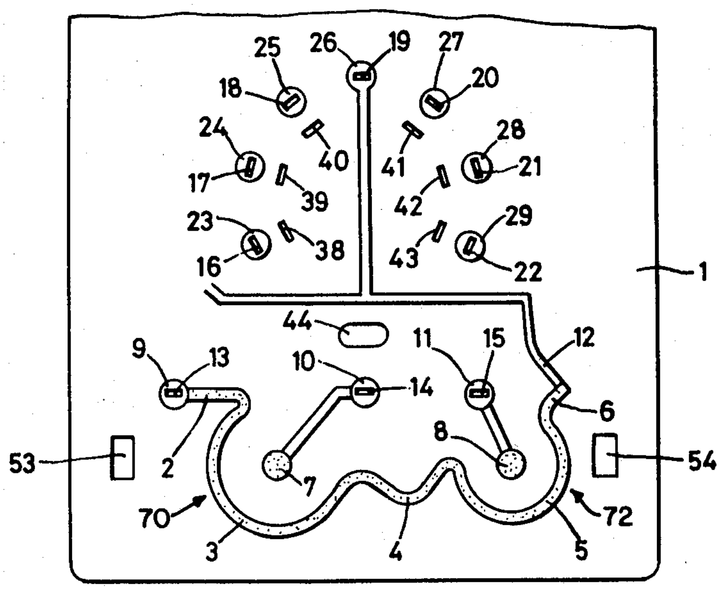
FIG. 2 is a plan view of an insulating substrate seen in FIG. 1.
Figure 3:
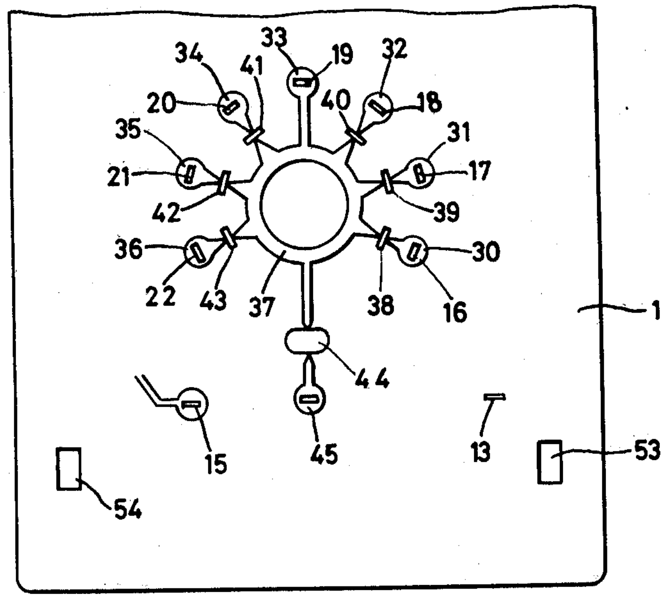
FIG. 3 is a reverse view of the same insulating substrate as shown in FIG. 2.

In the figures, the reference numeral 1 indicates commonly to all of these three figures an insulating substrate made of ceramics such as alumina, steatite, forsterite, and the like, while, especially in FIG. 2, numerals 2,3,4,5 and 6 designate film resistors which are provided in series at least to the one side of the surface of the same insulating substrate 1. The film resistors 2, 4, and 6 each form fixed resistors, the film resistor 3 forms the resistance part of a high-voltage variable resistor 70 which forms part of the circuit for supplying the focus voltage to the focus electrode of the CRT, and the film resistor 5 forms the resistance part of another high-voltage variable resistor 72 which forms part of the circuit for supplying the screen voltage to the screen electrode of the CRT, separately. Numerals 7 and 8 indicate the center electrodes of the high voltage variable resistors 70 and 72 respectively, and numerals 9 and 12 indicate the terminal electrodes which are connected to the corresponding film resistors. Numerals 10 and 11 indicate the terminal electrodes which are connected to the corresponding center electrodes 7, 8 through conductive paths. Electrodes 9–11 are each provided with respective through holes 13, 14 and 15 on their own substrate parts. Numerals 16, 17, 18, 19, 20, 21 and 22 indicate through holes which are provided in a circular arc-shape on the central part of the substrate 1 and into which the pin terminals of the cathode-ray tube socket 56 (FIG. 1) are to be inserted. Provided around each of these through holes are the respective electrodes 23, 24, 25, 26, 27, 28 and 29, and the respective electrodes 30, 31, 32, 33, 34, 35 and 36, located on reverse sides of the substrate 1. In this connection, the through hole 19 is for receiving the ground pin terminal of the cathode-ray tube socket 56, and the electrode 26 surrounding it on the surface of the substrate 1 is connected integrally to the terminal electrode 12 of the film resistor 6, while the corresponding electrode 33 on the reverse side of the substrate 1 is connected to a ring-shaped ground electrode 37 which is provided on the central part of substrate 1 and is surrounded by the through holes 16 to 22. Numerals 38, 39, 40, 41, 42 and 43 are through holes forming discharging gaps which are provided on the substrate 1 between each of the electrodes 30, 31, 32, 34, 35 and 36 and the ring-shaped electrode 37, both on the reverse side of the substrate 1, wherein the discharging ends of the electrodes 30–36 protrude opposite to the ring-shaped electrode 37 with the through holes 38–43 between them. Numeral 44 indicates a through hole forming a discharging gap which is provided on the substrate 1 between the ring-shaped electrode 37 and an electrode 45 that is provided on the reverse side of the substrate 1 just at the back of the through hole 14 passing through the terminal electrode 10 being connected to the center electrode 7 of the aforesaid focusing voltage resistor 70. Two discharging ends of electrodes protrude opposite to each other from each of the electrode 45 and the ring-shaped electrode 37 with the through hole 44 located between them.

Though not shown in the figures, there are disposed on either of the opposite sides of substrate 1 various electronic parts such as transistors, resistances, condensers, etc. which are to construct the necessary peripheral circuitry of the cathode-ray tube, such as, for example, a color output circuit (shown schematically at 60), whereby the respective outputs required shall be delivered to the electrodes around the through holes into which are inserted the pin terminals of the cathode-ray tube socket 56.

Reference numeral 46 in FIG. 1 indicates an insulating case made of synthetic resin and the like being constructed on the surface of the insulating substrate 1 so as to cover the film resistors 2, 3, 4, 5 and 6. Numeral 47 indicates a rotary shaft projecting over the upper face of the above insulating case 46. This rotary shaft 47 is provided connectively with a flanged part 49 being furnished with a slider 48 which slides over the film resistor 3 of the focusing voltage variable resistor 70 for the focus voltage with the center electrode 7 of the same film resistor 3 as the central part.

Reference numeral 50 indicates another rotary shaft being constructed in the same manner as the former rotary shaft 47. This defines part of the screen voltage variable resistor 72 for the screen voltage.

Incidentally, the insulating case 46 is mounted on the substrate 1 elastically by inserting hook-shaped pieces 51 and 52 which are fit up at its both ends in the longitudinal direction into through holes 53 and 54.

Reference numeral 55 indicates one terminal, which is inserted into the through hole 13 located at the terminal electrode 9 of the film resistor 2 and extends through the reverse side of the substrate 1. This terminal 55 may be made in any suitable form as of a plate or a cylinder. Connected to this terminal 55 is the output end of the rectifier circuit being connected to the high-voltage winding of the fly-back transformer. Numeral 56 indicates the cathode-ray tube socket being attached to the reverse side of the substrate 1, wherein each of the pin terminals of the socket 56 is inserted into its own predetermined through hole 13–22, and then each is fixedly soldered on the electrode surrounding its own through hole. The pin terminal of the cathode-ray tube socket 56 associated with the focus electrode of the CRT is inserted into the through hole 14 of the terminal electrode 10 which is connected to the center electrode 7 (forming part of the focusing voltage variable resistor 70) at the time that the other pin terminals are inserted into their own through holes, and then is connected to the same electrode 10 and secured thereon. On the other hand, the terminal electrode 11 which forms part of the screen voltage variable resistor 72 is connected on the reverse side of the substrate to the pin terminal of the cathode-ray tube socket 56 associated with the screen electrode of the CRT socket by means of the through hole 15.

Reference numeral 57 indicates an insulating sleeve being provided as covering over the above-mentioned terminal 55 and being formed integrally with the cathode-ray tube socket 56. This insulating sleeve 57 is covered with an insulating packing (not shown) after the output end of the rectifier circuit has been connected to the terminal 55, thereby preventing discharge from the point of the terminal 55.

The cathode-ray tube socket substrate in accordance with the present invention, which is so constructed as described above, is not limited to the foregoing example. The position, for instance, of the film resistors 3–5 forming the high-voltage variable resistors 70, 72 on the insulating substrate 1, or the setting positions of the through holes 13–22 into which the pin terminals of the cathode-ray tube socket 56 are to be inserted, are all generally optional and may be appropriately selected according to the configuration of the whole circuitry. Besides, although there are provided on the substrate 1 two kinds of high-voltage variable resistors 70, 72 for the focus and screen voltages, respectively, in the above-described example, it is permissible to employ a screen voltage variable resistor constructed separately from the substrate 1. Even in such a construction, it does not raise any question since the screen voltage shows satisfactorily a lower value as compared with the focus voltage. Apart from the above, it will be possible to set a certain kind of resistor consisting of a film resistors between the center electrode 7 of the film resistor 3 forming the focus voltage variable resistor 70 and the terminal electrode 10 being connected thereto.

Additionally, it should be clear that the cathode-ray tube socket substrate according to the present invention is not only usable in color television receivers, but also applicable to the other cathode-ray tube display units such as black-and-white television sets. By way of example, in the case of the application of it to a black-and-white television set, needless to say, without having a color output circuit in the peripheral circuitry of the cathode-ray tube, it will be constructed on the substrate 1 integrally with an ordinary image output circuit and the other suitable peripheral circuitry of the cathode-ray tube.

For the cathode-ray tube socket substrate according to the present invention, it is now to be understood that various modifications and changes may be carried out otherwise than as described above. The upshot is that it will do well whether, at the time of constructing the focusing voltage variable resistor integrally with the substrate 1, a pin terminal for the focus electrode of the cathode-ray tube socket 56 is inserted into a through hole being provided on the electrode area for the focus voltage in such manner that the same pin terminal can be connected to the focus voltage electrode; or otherwise the integral construction of the high-voltage variable resistor with the substrate 1 is made in such manner that there is provided a through hole on the substrate of the input terminal electrode area as a terminal electrode to which is connected the output end of the rectifier circuit being connected to the high-voltage winding of the fly-back transformer, that a terminal being connected to the same output terminal electrode is made to penetrate through the above-mentioned through hole and is pulled out over the reverse side of the substrate, and that the portion of the terminal extending through the reverse side of the substrate 1 is jacketed by an insulating sleeve 57 being formed integrally with the cathode-ray tube socket 56.

In the cathode-ray socket substrate according to the present invention which is constructed as described above, the focus voltage variable resistor 70 is constructed very compactly and integrally with the socket substrate 1 without requiring some superfluous space within the set of television receiver.

In addition, it does not need an outgoing line as long as previously required. Accordingly, it has various kinds of effects that there is no fear of incurring inductive interference or the like, that is very easy to be assembled, and that it is advantageous from the viewpoint of the production cost, etc.

What is claimed is:

1. A cathode-ray tube socket assembly, comprising:

(A) an insulating substrate having N through holes formed therein, N being an integer greater than 1;

(B) N electrodes provided on said subtrate, each said electrode being associated with a respective said through hole;

(C) a cathode-ray tube socket having N pin terminals and being located on a first side of said substrate, one of said pin terminals being a focus electrode pin terminal and extending through a first said through hole and being electrically connected to the electrode associated with said first through hole, each of the remaining said pin terminals being inserted into a respective one of the remaining said through holes and being electrically connected to said electrode which is associated with the said through hole through which said pin terminal extends;

(D) a color output circuit mechanically coupled to said substrate and electrically connected to at least one of said pin terminals of said cathode-ray tube socket;

and (E) a high-voltage variable resistor provided on said insulating substrate for applying a focus voltage to said focus electrode pin terminal of said socket, said high-voltage variable resistor comprising:

(1) a center electrode electrically connected to said electrode associated with said first through hole;

(2) an arcuate film resistor defining a variable resistance part, said film resistor and said center electrode being located on a second side of said insulating substrate which is opposite said first side of said insulating substrate; and (3) a rotary shaft provided with a slider, one part of which is in contact with said center electrode, a second part of which is in contact with and slides along said arcuate film resistor; and (F) an insulating casing mounted on said insulating sustrate and covering both said film resistor and said center electrode, said casing rotatably supporting said rotary shaft.

2. A cathode-ray tube socket assembly according to claim 1, further including:

an input terminal through hole formed in said substrate;

an input terminal electrode formed on said insulating substrate and defining an input terminal for said arcuate film resistor;

a terminal extending through said input terminal through hole and being electrically connected to said input terminal electrode, said terminal projecting outwardly from said first side of said substrate and being at least partially surrounded by an insulating sleeve which is an integral part of said cathode-ray tube socket.

3. A cathode-ray tube socket assembly according to claim 1, in which one of said N electrodes is a ground electrode, the remaining said N electrodes being provided with a respective discharging end, each of said discharging ends of said remaining N electrodes extending to a first side of a respective discharge gap formed in said substrate, said ground electrode including N discharging ends, each of which extends to a second side of a respective said discharge gap.

4. A cathode-ray tube socket assembly according to claim 3, wherein said ground electrode is ring-shaped and is located in an area surrounded by said N through holes said discharge gaps lying in a circle located between said ground electrode and said N through holes.

* * * * *